United States Patent
Takahashi

(10) Patent No.: US 8,278,142 B2
(45) Date of Patent: Oct. 2, 2012

(54) COMBINED METALLIC BONDING AND MOLDING FOR ELECTRONIC ASSEMBLIES INCLUDING VOID-REDUCED UNDERFILL

(75) Inventor: Yoshimi Takahashi, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 532 days.

(21) Appl. No.: 12/469,935

(22) Filed: May 21, 2009

(65) Prior Publication Data

US 2009/0291524 A1 Nov. 26, 2009

Related U.S. Application Data

(60) Provisional application No. 61/055,289, filed on May 22, 2008.

(51) Int. Cl.
*H01L 21/00* (2006.01)
(52) U.S. Cl. .......................................... 438/106; 438/108
(58) Field of Classification Search .................. 438/106, 438/108
See application file for complete search history.

(56) References Cited

U.S. PATENT DOCUMENTS

| 2003/0000067 A1* | 1/2003 | Hori ............................... 29/592.1 |
| 2005/0158502 A1* | 7/2005 | Otsuki et al. .................. 428/40.1 |
| 2009/0045507 A1* | 2/2009 | Pendse et al. .................. 257/734 |
| 2009/0154132 A1* | 6/2009 | Okamoto et al. ............. 361/804 |
| 2009/0278244 A1* | 11/2009 | Dunne et al. .................. 257/676 |

* cited by examiner

*Primary Examiner* — Jae Lee
(74) *Attorney, Agent, or Firm* — Steven A. Shaw; W. James Brady; Frederick J. Telecky, Jr.

(57) ABSTRACT

A method for forming electronic assemblies includes providing a plurality of IC die each having IC bonding conductors and a workpiece having workpiece bonding conductors. A curable dielectric film is applied to the IC bonding conductors or the workpiece surface. The plurality of IC die are placed on the workpiece surface so that the plurality of IC bonding conductors are aligned to and face the plurality of workpiece bonding conductors to provide a first bonding. The placing is performed at a vacuum level corresponding to a pressure <1 kPa, and at a temperature sufficient to provide tackiness to the curable dielectric film. The plurality of IC die are then pressed to provide a second bonding. A temperature during pressing cures the curable dielectric film to provide an underfill and forms metallic joints between the plurality of IC bonding conductors and the plurality of workpiece bonding conductors.

21 Claims, 7 Drawing Sheets

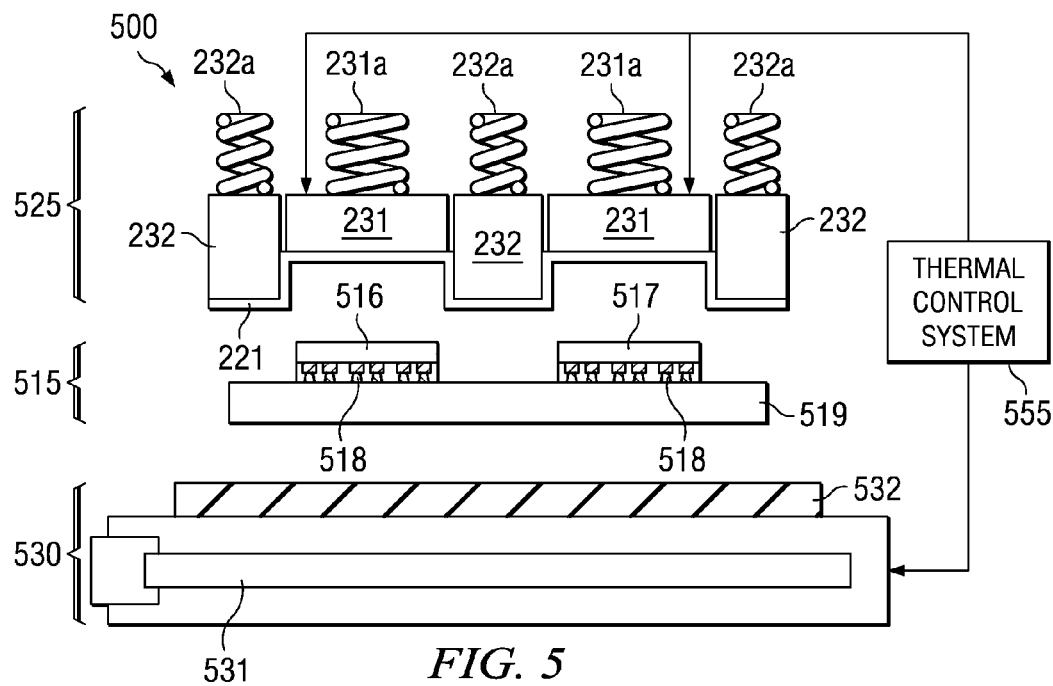
FIG. 5
| POSITION | PROCESS STEP AND STATE | CHIP (BUMP) | SUBSTRATE |
|---|---|---|---|
| (1) | SUBSTRATE ON STAGE BEFORE CLAMP | RT/NO FORCE | RT/NO FORCE |
| (2) | OUTER PRESS HOLDS SUBSTRATE TO PREVENT SUBSTRATE EXPANSION | ~40degC /NO FORCE | ~100~150degC /FORCED |
| (3) | INNER PRESS TOUCHES TO CHIP AND APPLIES FORCE | ~180~250degC /1gf/bump~ | ~180~250degC /FORCED |
| (4) | AFTER CURE COMPLETION, BOTTOM TOOL GOES DOWN | ~180~250degC /NO FORCE | ~180~250degC /NO FORCE |
FIG. 6A
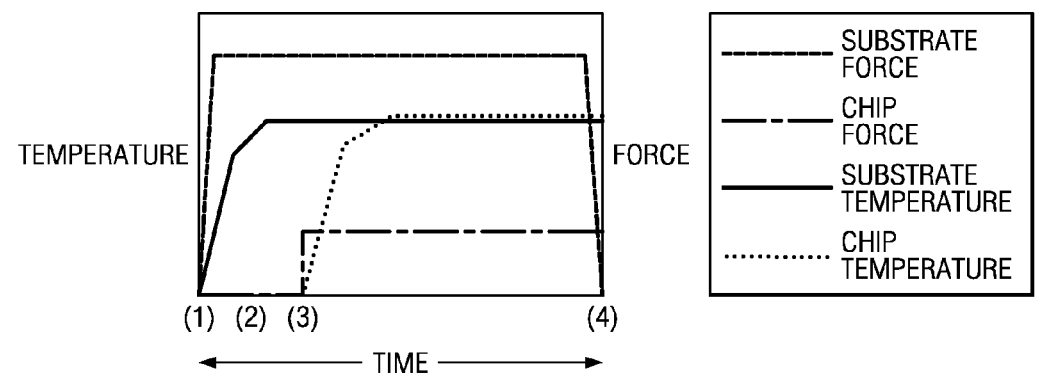
FIG. 6B

COMBINED METALLIC BONDING AND MOLDING FOR ELECTRONIC ASSEMBLIES INCLUDING VOID-REDUCED UNDERFILL

CROSS REFERENCE TO RELATED APPLICATIONS

This application claims the benefit of Provisional Application Ser. No. 61/055,289 entitled "P3 (Pick up, Plane and Press) Bond for Flip Chip and Silicon Through Hole Joint," filed May 22, 2008, which is herein incorporated by reference in its entirety.

FIELD OF THE INVENTION

Embodiments of the present invention generally relate to integrated circuit (IC) assembly manufacturing processes and more particularly to IC-to-package substrate or IC-to-wafer assembly and electronic assemblies therefrom.

BACKGROUND

Flip-chip technology has recently moved from a specialized packaging application to mainstream production as an important method for improving circuit densities, reliability and cost in miniaturized electronic products. The use of an underfill encapsulant beneath the flip-chip die is generally necessary to improve reliability by reducing the strain on the solder bumps during thermal cycling imposed by coefficient of thermal expansion (CTE) differences between the IC die and the substrate. By adhering to all surfaces under the die, the underfill adhesive makes the die-adhesive-substrate system significantly stiffer. The underfill adhesive also keeps the solder bump in hydrostatic compression, thus increasing fatigue endurance and holding the bump intact under strain.

Both capillary underfill and no-flow underfill processes are known. Basically, conventional capillary underfill dispensing takes place in the production line after the reflow process, whereas no-flow underfill is dispensed before placement of the IC die and is designed to cure during the reflow process. The capillary underfill process requires an additional cure oven and a means to flux the area before reflow. Both processes require a dispenser.

A conventional wafer scale bonding method for attaching an IC die to a substrate (e.g., PCB) based on capillary underfill comprises soldering the IC die (e.g., as a flip chip) to the substrate and then injecting an underfill material between the IC die and the substrate. Capillary flow causes the underfill to seal the area between the IC die and the substrate that is not occupied by the soldered areas of connection. An underfill cure step then occurs. Injection of underfill is known to result in a significant density of underfill voids, particularly when the geometries (e.g., of the gaps) to be filled are relatively small. Voids typically result in a loss of reliability. Moreover, a drawback with soldering the IC die to the substrate is that the various components contract at different rates during bonding.

Another method of attaching an IC die to a substrate is a "no-flow" underfill method which generally comprises thermal compression bonding (TCB) IC die to the substrate. A typical TCB process includes covering the solder bumps on a substrate with an underfill precursor material and then positioning solder bumps on an IC die in a flip chip configuration against the solder bumps on the substrate. A pressing step simultaneously applies heat to the solder bumps, and causes solder interconnect reflow and underfill cure. One of the advantages of TCB over conventional capillary flow processes is that the extra processing steps that are associated with a capillary flow process (e.g., flux application, flux residue cleaning and secondary thermal curing of the underfill) are eliminated. However, TCB like conventional wafer scale bonding, is known to result in generation of a significant density of reliability reducing underfill voids, many of which can be of significant size.

Conventional microelectronics assembly equipment for pressing to form metallic joints generally comprises a clamshell arrangement, where the first and second clam shell portions of the "clam" are coupled by a hinge. The clamming motion is used to simultaneously press together a plurality of IC die that are on the surface of a wafer or package substrate by applying a compressive force that is oriented vertical with the respect to the surface of the wafer or package substrate. Heat applied during the pressing step provides heat for the solder interconnect reflow and underfill cure to occur simultaneously.

SUMMARY

The Present Inventor has recognized that conventional microelectronic assembly processes that include forming metallic joints generally have one or more problems, including throughput/cost, underfill voiding, and misaligned joints. Embodiments of the invention as described below generally provide high throughput/low cost, reduced underfill voiding and improved joint alignment.

Although TCB as described above generally provides high throughput and thus low cost, TCB generally results in a significant density of underfill voids, which can also be of significant size. Capillary underfill may reduce the density and size of underfill voids compared to PCB, but as the size of the gap to be filled is reduced, as is the current trend, the height of the gap for injection may not be enough and result in incomplete filling.

Regarding misalignment of joints, the Present Inventor has recognized a problem with pressing using conventional clamshell based pressing equipment is that the clamming motion, which pivots around a hinge, necessarily causes the respective clam shells of the clam to meet at an angle other than 90 degrees during pressing, and thus imparts a lateral (horizontal) force on the IC die relative to the wafer or package substrate surface. Even though the deviation from 90 degrees (vertical) may be small, the deviation can be sufficient to shift the IC die relative to the wafer or package substrate surface to result in misaligned joints. Misaligned joints can result in high resistance joints, or even open circuits, as well as reduced reliability.

Embodiments of the invention include methods for forming electronic assemblies. A plurality of IC die each comprising a plurality of IC bonding conductors which are coupled to the active circuitry, and a workpiece comprising a workpiece surface having a plurality of workpiece bonding conductors thereon are provided. A curable dielectric film is applied to at least partially cover the plurality of IC bonding conductors or onto the workpiece surface. The plurality of IC die are placed on the workpiece surface so that the plurality of IC bonding conductors are aligned to and face the plurality of workpiece bonding conductors to provide a first bonding. The placing is performed at a vacuum level corresponding to a pressure <1 kPa (<7.5 torr), and at a temperature high enough to provide tackiness to the curable dielectric film. The plurality of IC die are pressed to provide a second bonding. A temperature during pressing is sufficient to cure the curable dielectric film to provide an underfill and to form metallic joints between the plurality of IC bonding conductors and the plurality of workpiece bonding conductors.

The vacuum applied during the placing/first bonding has been found by the Present Inventor to significantly reduce voiding and/or the size of the voids in the underfill as compared to convention TCB processing. Other embodiments of the invention describe new pressing systems and related methods that form a closed volume around the IC die when the workpiece comprises a package substrate and a substantially closed volume in the case the workpiece comprises a wafer, which has been found by the Present Inventor to further reduce underfill voiding and/o the size of the voids.

Embodiments of the invention are also described for reducing joint misalignment. Embodiments of the invention include presses that unlike conventional clam-shell based pressing equipment do not pivot around a hinge, that press with a nearly 90° force to simultaneously push the plurality of ICs to reduce joint misalignment. Particularly for package substrate applications, the pressing can utilize a pressing system comprising a first pressing head for pressing each of the plurality of IC die and an independently movable second pressing head for pressing the package substrate surface beyond the IC die to help keep the package substrate from bowing (expanding) during pressing, wherein the first pressing head initially contacts the plurality of IC die at a maximum tilt angle of 0.2 degrees. Separate pressing heads allow a different force/area (pressure) to be applied to the substrate as compared to the force/area applied to the IC die, as well as the pressing heads to contact at different times.

Moreover, embodiments of the invention generally provide high throughput. One aspect of embodiments of the invention that provides high throughput is the curing of the curable dielectric film during pressing, thus eliminating the need for a separate curing step.

BRIEF DESCRIPTION OF THE DRAWINGS

FIG. 5 shows a simplified exploded view depiction of a pressing system including independent inner presses and outer presses configured for simultaneously curing resins to form underfill and forming metallic joints between a plurality of ICs and a workpiece, wherein the pressing system includes structure for separately controlling the temperature of the upper die tool and bottom die tool, according to an embodiment of the invention.

FIG. 6A is a table showing exemplary assembly process steps 1-4 and process states therein, while FIG. 6B shows an exemplary plot that shows the IC and substrate temperature and the force applied to the substrate and IC as a function of time, for process steps 1-4, obtainable using the pressing system shown in FIG. 5, according to an embodiment of the invention.

DETAILED DESCRIPTION

Figure 1:
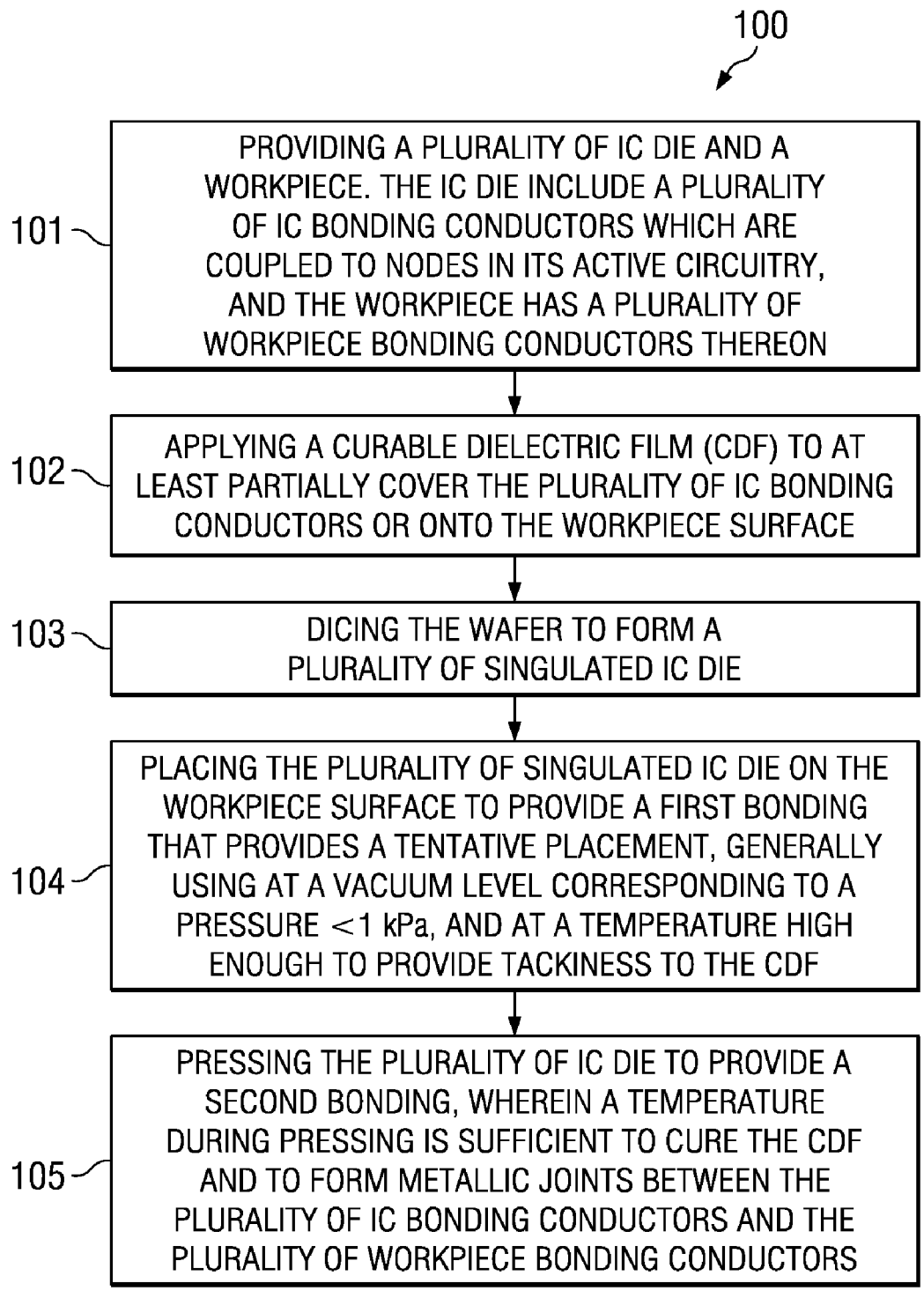
FIG. 1 shows steps in an exemplary method including a two-step process for bonding and molding for forming electronic assemblies, including vacuum during the first bonding/molding step for reducing underfill voiding, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A first embodiment of the present invention comprises a two-step process for combined metallic bonding and molding to form electronic assemblies that include a vacuum during the first bonding/molding step to reduce underfill voiding in the finished electronic assembly. FIG. 1 shows steps in an exemplary method 100 including a two-step process for metallic bonding and molding for forming electronic assemblies, according to an embodiment of the invention. Step 101 comprises providing a plurality of IC die and a workpiece. The IC die each comprise a top surface including active integrated circuitry and a bottom surface that is opposite the top surface. At least one of the top surface and the bottom surface comprise a plurality of IC bonding conductors which are coupled to nodes in the active circuitry (e.g., power, ground, I/Os).

The IC bonding conductors can generally comprise any suitable bonding structure such as bond pads, TSVs, or pillars. For example, the plurality of IC bonding conductors can comprise TSVs having protruding TSV tips (e.g., 10 to 35 μm tip heights), which permits the plurality of IC die to be placed and bonded face-up on the workpiece surface. In another embodiment, the plurality of IC bonding conductors comprise pillars or stud bumps (e.g., solder or gold), which permits the plurality of IC die to be placed and bonded in a flip-chip orientation on the workpiece surface. The TSV or pillar, such as in the case of copper, can include a surface finish, such as electroless Ni/Pd or Ni/Au. Pd and Au are easily wettable by solder. Alternatively, The TSV or pillars can include solder thereon. Surface finishes or solder can prevent copper from be directly exposed to the environment where it tends to oxidize.

The workpiece comprises a workpiece surface having a plurality of workpiece bonding conductors thereon. The workpiece can comprise a package substrate, such as a printed circuit board (PCB). For example, a polyimide substrate such as micro-BGA. The workpiece can also comprise a lead frame sheet. For example, a quad flat pack no pins (QFN). For the package substrate or lead frame embodiments, the surface of the workpiece can have a fan-out trace pattern to the outside of the package or solder balls. In another embodiment, the workpiece comprises a wafer, and the wafer comprises a plurality of non-singulated die.

In one embodiment of the invention the joint metallization is copper-based (e.g., copper TSVs, copper pillars, or copper bond pads) with solder mediation. Solder helps avoid oxidation of copper. The solder is also generally effective works to absorb (compensate for) tilt during pressing for addressing TSV tip or pillar height variation. In one embodiment of the invention the solder thickness is 6 to 20 µm. As described above, solder can be on the TSV tips, pillars, or the bump pads of the IC, or the workpiece bonding conductors, or both.

Step 102 comprises applying a curable dielectric film (CDF) to at least partially cover the plurality of IC bonding conductors on the IC die or onto the workpiece surface. In the case the CDF is applied to the IC bonding conductors, the CDF can be applied when the IC die are still in wafer form so that the CDF can be applied to laminate a plurality of the IC die on the wafer. The CDF can be laminated on bottom side of the wafer in the case of IC die having TSV tips, or on the top side in the case of pillars or conventional bump pads. In either the TSV, pillar or bump pad case, the CDF can function as a dicing film. For example, after dicing/singulation, as described below, the CDF can be used to form underfill for the region adjacent to the TSV, pillar or bump pad joint to the workpiece bonding conductors (e.g., land pads) beneath the IC die. In the case of TSVs or pillars, such as copper TSVs or pillars, the CDF can be laminated shortly after the TSV tips or pillars are exposed to the environment. If the CDF is at least as thick as the height of the TSV tips or pillars, the CDF can protect the TSV tips or pillars from oxidization.

In another embodiment of the invention, instead of laminating the CDF to the IC die, the CDF is laminated on the workpiece surface. This embodiment may have a cost advantage, such as for pillar-based contacts, since forming Cu pillars on a workpiece is generally cheaper as compared to forming Cu pillar on wafers. Moreover, it allows selection of only known good IC die. Moreover, applying the CDF to the workpiece surface minimizes waste of CDF material as compared to application to a wafer which will laminate CDF on all die, including IC die that are later rejected. The workpiece (e.g., solder on pillar) can be cleaned using a plasma cleaner after CDF processing to ensure a good subsequent bond.

In one embodiment, the CDF material prior to curing provides a low melt viscosity, such as lower than 500 to 1000 pascal-second (Pa·s), a transparency of at least 35% for visible light on average, at least 50 wt. % filler, and fast curability, such as a 30 second cure time for a temperature of at least 180° C. The CDF is generally at least 15 µm thick and can be selected to have a thickness that at least matches the height of the TSV tips or pillars in such embodiments. The CDF material can includes flux. As known in the art, a flux refers to a chemically- or physically-active formulation capable of cleaning oxides and enabling wetting of metals (e.g., copper) with solder. Flux is generally included in the CDF when the bonding conductors include highly oxidizable metals, such as copper.

Step 103 generally comprises dicing the wafer to form a plurality of singulated die. The singulated die are then generally sorted to a chip tray. However, step 103 is not generally used if the plurality of IC are on a wafer that is to be bonded to the workpiece. Not only can the IC die be on a wafer, in some embodiments of the invention the workpiece can be a wafer having a plurality of IC die.

Step 104 comprises placing the plurality of IC die on the workpiece surface so that the plurality of IC bonding conductors are aligned to and face the plurality of workpiece bonding conductors to provide a first bonding that provides a tentative placement. In one embodiment of the invention, as noted above, the plurality of IC die are in wafer form and the workpiece is also in wafer form so that wafer-to-wafer interconnection is realized. For example, the wafer notch and wafer outline can be used for alignment purposes.

The placing is generally performed at a vacuum level corresponding to a pressure <1 kPa (approximately <7.5 torr), and at a temperature high enough to provide tackiness to the CDF. As known in the art of vacuum technology, a rough vacuum is generally regarded as a pressure from 760 Torr to 1 Torr, and a medium vacuum a pressure from 1 Torr to $10^{-3}$ Torr. Although embodiments are generally described herein for bonding/molding a plurality of single IC die across the area of a workpiece, as described below relative to FIG. 3A-D, embodiments of the invention can also simultaneously bond/mold two or more stacked IC die to form metallic joints for the respective ICs between one another and the workpiece using a single pressing.

A <1 kPa vacuum for the first bonding step has been found to generally remove most of the air remaining in CDF, as well as the air in and around the IC bonding conductors (e.g. TSV tips, pillars or bumps). Significantly, the Present Inventor has found that if such vacuum processing is not used for the placing/first bonding, the CDF upon subsequent curing generally has a high concentration of voids and/or large voids as well as a high concentration of voids and/or large voids around the IC bonding conductors likely due to air bubbles, such as around solder on the tips of the copper pillars or TSV tips. The Example below quantifies this finding.

The temperature to provide tackiness to the CDF is dependent on the CDF composition and can be based on the lowest melt viscosity temperature of the CDF, which is generally a resin. The temperature to provide tackiness is typically between at least 60° C. and a temperature of minimum melting viscosity for the CDF. The placing/first bonding is generally performed in a temperature range of between 80 to 120° C.

The placement force can be selected to be sufficient for the IC bonding conductors to penetrate the CDF sufficiently to touch the workpiece bonding conductors (e.g., the top of bumps to touch the substrate land pads). In one embodiment the placement force/area is 10 to 100 N/cm².

Step 105 comprises pressing the plurality of IC die to provide a second bonding to provide metallic bonding and also molding, wherein a temperature during the pressing is sufficient to cure the CDF to form underfill and to form metallic joints between the plurality of IC bonding conductors and the plurality of workpiece bonding conductors. There is thus no need to inject underfill. The Present Inventor has found that the pressing can be performed under ambient (non-vacuum) conditions without generally increasing the concentration or size of underfill voids. In one embodiment, a heat resistant release film is positioned to contact the plurality of IC die during pressing to protect the surface of the IC die. For example, the heat resistant material such as PTFE can be used.

The temperature for step 105 is above the temperature for step 104 and is generally at a temperature between 120 to 300° C. In embodiments of the invention in which solder is used for joining, the temperature for step 105 is generally at least the reflow temperature for the solder composition (e.g. 180 to 250° C.).

In one embodiment of the invention the IC die and workpiece temperatures are separately controlled, and the peak temperature for the IC die is generally at least 100° C. above a peak workpiece temperature during step 105. In this embodiment, the peak die temperature can be 180 to 250° C. and the peak workpiece temperature can be <60° C.

Another embodiment of the invention relates to pressing using a pressing system that provides at least a partial enclosure (e.g., a cavity) around each IC die to remove a portion of the air from the partially enclosed or fully enclosed volume. This feature has been found by the Present Inventor when combined with using vacuum during the first bonding can further reduce the concentration and/or the size of the voids in the underfill.

In embodiments of the invention that the workpiece comprises a package substrate having a package substrate surface, and the plurality of IC die comprise a plurality of singulated IC die, the pressing system for the pressing step 105 can comprise a first pressing head for pressing each of the plurality of singulated IC die and an independently movable second pressing head for pressing the package substrate surface on portions of the package substrate surface beyond the area occupied by the plurality of singulated IC die.

In one embodiment the pressing system comprises two separate pressing dies that provide different force levels. For example, the separate pressing dies can have different strength springs. The outside spring which applies a force beyond the IC die and generally contacts the workpiece surface around the IC die helps preventing bleeding out of uncured CDF material that is generally resin-like. The force/area provided by the outer pressing die to prevent the bleed out is generally above about 60 Kgf/cm$^2$. The force/area provided by the inner pressing die that contacts the ICs is generally 0.5 to 1-30 Kgf/cm$^2$. The enclosure formed by the pressing dies when depressed helps reduce or minimize inner voids of CDF and as a result voids in the underfill formed.

Figure 2A:
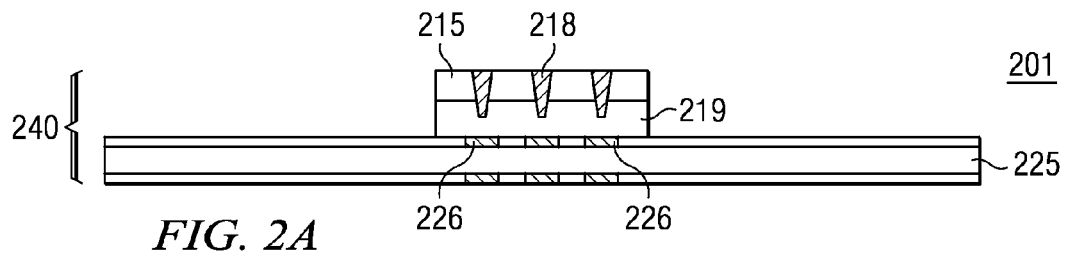
FIG. 2A-E shows a depiction of a process flow showing an exemplary pressing system for bonding/molding a plurality of singulated IC die to a package substrate, according to an embodiment of the invention.

FIG. 2A-D shows a depiction of a process flow comprising steps 201-204 that also shows a depiction of an exemplary pressing system 220 for bonding a plurality of singulated IC die with a single IC die 215 shown to a package substrate 225 (e.g. a PCB), according to an embodiment of the invention. In step 201 as shown in FIG. 2A, a plurality of IC die including IC die 215 are placed and initially bonded to the package substrate 225 to form a bonded substrate 240 having a plurality of IC die thereon. IC die 215 is shown having a plurality of TSVs 218, and the package substrate 225 is shown having a plurality of workpiece bonding conductors 226, such as solder capped copper land pads.

The CDF 219 is shown between the bottom of the IC die 215 and the surface of the package substrate 225. As described above, the placing/first bonding is performed at a vacuum level corresponding to a pressure <1 kPa (<7.5 torr) to limit air bubble and thus void formation in the CDF, and at a temperature high enough to provide tackiness to the CDF, typically at least 60° C. and at least 20° C. below the curing temperature of the CDF.

Figure 2B:
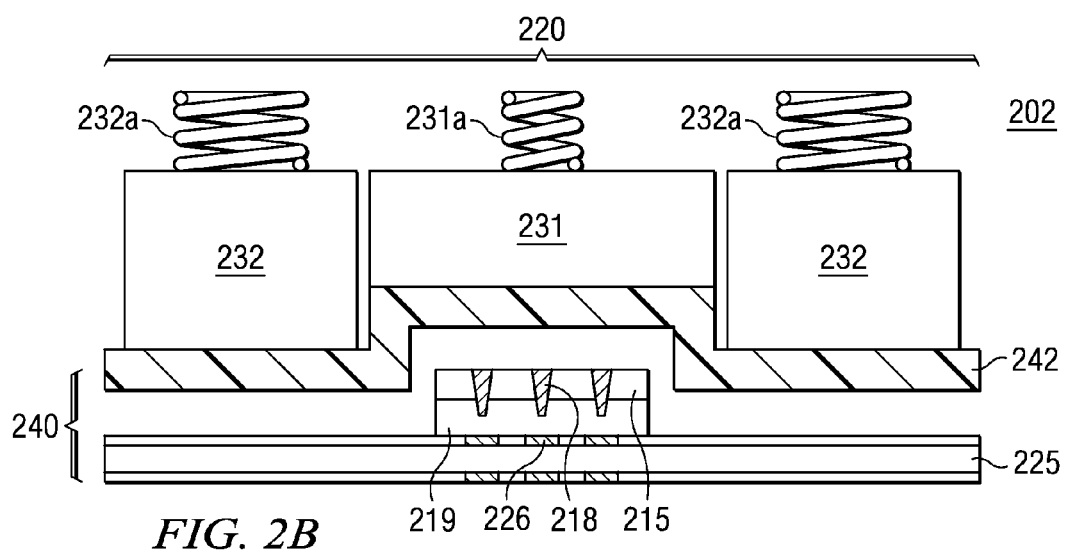

In step 202 shown in FIG. 2B, the bonded substrate 240 is shown after placement in pressing system 220, typically on a bottom die tool that can include a suction line and locator pins (not shown) to hold the package substrate 225. The pressing system 220 is not a conventional clam-shell based pressing system, but is rather a system comprising a vertically moveable upper die tool and a generally fixed lower die tool which is thus capable of imparting almost exclusively vertical pressure. One exemplary pressing system design is based on a Cavity Direct Injection Molding (CDIM) tool. One vendor for a CDIM tool is Apic Yamada (Apic Yamada Corporation, 90 Kamitokuma, Chikuma-shi, Nagano-ken, Japan). The CDIM tool is described by Apic Yamada for ejecting liquid resin on a circuit board and the top mold presses on the cavity of the chips while heating sufficiently to solidify the resin. The CDIM includes a vacuum system. Unlike conventional transfer molding, the CDIM method also uses little horizontal pressure due to springs above the pressing die (heads) and a generally fixed location support block (i.e. lower die tool) below the substrate. Embodiments of the invention as described below make a new pressing/metallic bonding use of a CDIM tool design. Moreover, as described below, modifications to the CDIM tool can be made to further improve the performance of the pressing tool for metallic bonding including reduced die slippage particularly for edge IC die (as opposed to center IC die).

A heat resistant buffer and release film 242 (e.g., PTFE) is shown attached to the pressing system 220 to help mechanically buffer the contact with the plurality of IC die 215 and the surface of the package substrate 225 during pressing. The release film 242 can also prevent resin overflow onto the surface of the IC die 215.

Figure 2C:
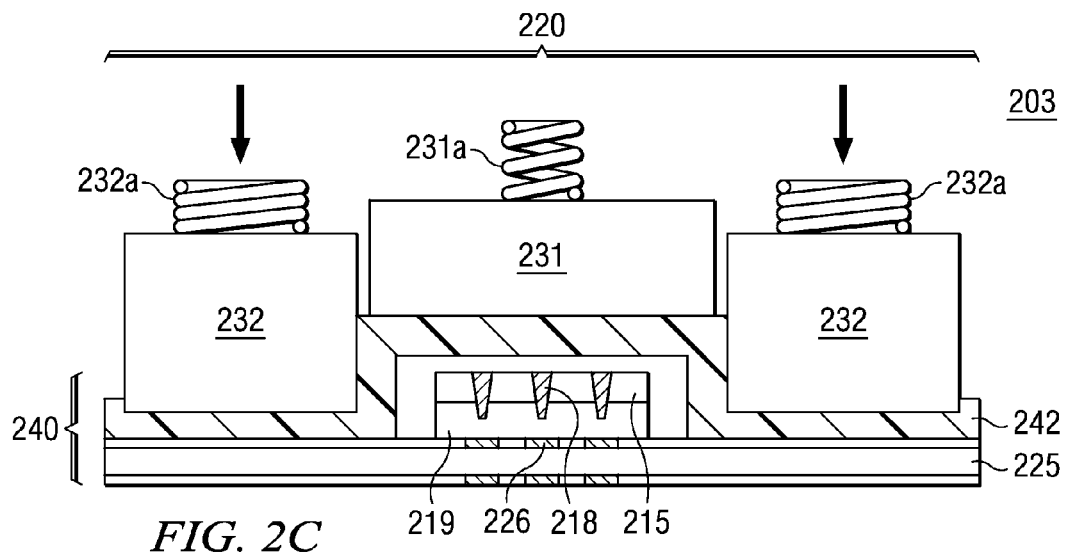

In step 203 as shown in FIG. 2C, the second pressing head 232 presses the surface of the package substrate 225 from above the package substrate 225 before the first pressing head 231 presses the surface of IC die 215. The upper die tool of the pressing system 220 is shown comprising first pressing head 231 including spring 231($a$) for pressing each of the plurality of singulated IC die 215 and an independently movable second pressing head 232 including spring 232($a$) for pressing the surface of the package substrate 225 in areas of the package substrate surface beyond the area of the singulated IC die 215.

The force applied by the second pressing head 232 to package substrate 225 holds the package substrate 225 to prevent expansion of the substrate 225 to keep the substrate 225 flat generally within 3 μm over its area so that when first pressing head 231 first contacts the top of the IC die 215, the package substrate 225 provides good flatness. This feature improves joint alignment and has been found to be effective to prevent or at least reduce bump slipping. Without first pressing on package substrate 225, the Present Inventor has recognized that the package substrate 225 tends to expand/warp, resulting in significant lateral movement of the IC die 215 and its IC bonding conductors shown as TSVs 218 resulting in significant joint horizontal misalignment following pressing by the pressing system 220.

In addition, with second pressing head 232 pressing the surface of the package substrate 225 and enclosed volume is formed which reduces the amount of air within the enclosed volume. As described above, such a reduction in air around the CDF has been found by the Present Inventor to further reduce void density and void volume.

Figure 2D:
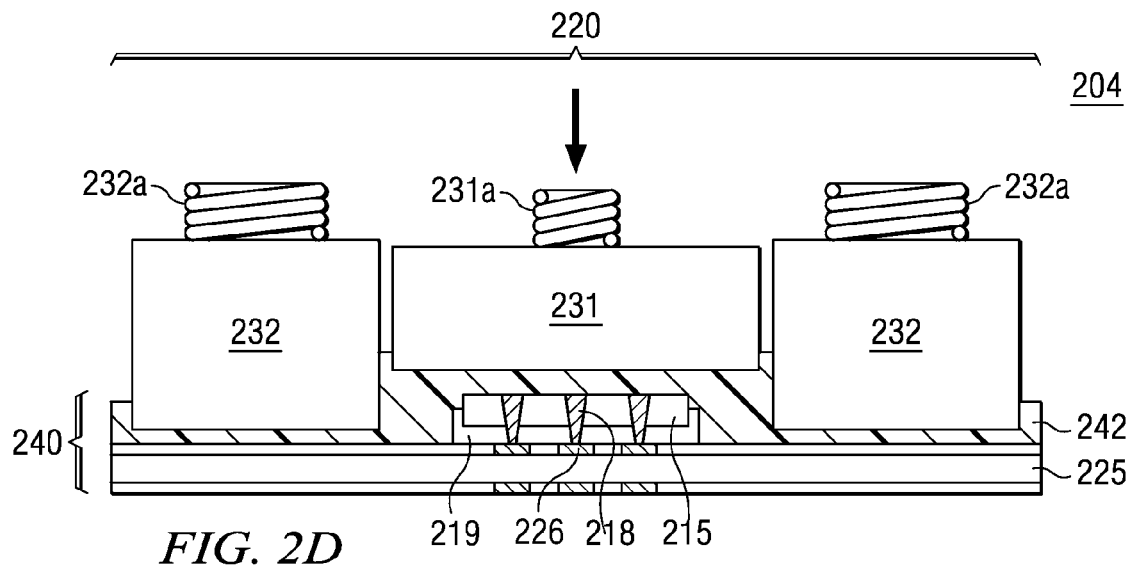

In step 204 as shown in FIG. 2D, the first pressing head 232 now presses the surface of the IC die 215 while the second pressing head continues to press the package substrate 225 to maintain good substrate flatness. Heat is applied (e.g. via first pressing head 231) sufficient to provide a second bonding to provide metallic bonding and also molding to form underfill, wherein a temperature during the pressing is sufficient to cure the CDF to form underfill and to form metallic joints between the plurality of IC bonding conductors 218 and the plurality of workpiece bonding conductors 226. The heat resistant buffer and release film 242 provides a buffering function and protects the IC die 215 during pressing. The first pressing head 231 contacts the plurality of IC die including IC die 215 at a maximum tilt angle of only 0.2 degrees.

A 0.2 degree tilt equates to a 34.9 μm tilt for a 10×10 mm IC die, or 17.5 μm in for a 5×5 mm IC die. The maximum tilt angle provided is generally ≦0.1 degrees. For example, a tilt angle of 0.1 degrees equates to a 17.5 μm tilt for a 10×10 mm IC die, and a 8.8 μm tilt for a 5×5 mm IC die. Embodiments of the invention thus allow high assembly yields for fine pitch bonding features, 50 μm pitches for peripheral and core bumps. Moreover, the reduced tilt during pressing and resulting reduction in bump slipping and resulting improved joint alignment may permit new IC die and workpiece designs to include finer pitched bonding features as compared to the finest pitched bonding features conventionally provided.

In the case of solder joints, the minimum solder thickness (height) can be determined by calculating the minimum thickness possible to cover the first pressing head 231 tilt (height difference) across the IC die 215 generated by tilt angle. For example, if tilt is 35 um, the minimum solder height is generally >35 um, and first pressing head 231 of the upper die tool 222 of the pressing system 220 should be moved vertically down 35 μm to contact each solder location.

Figure 2E:
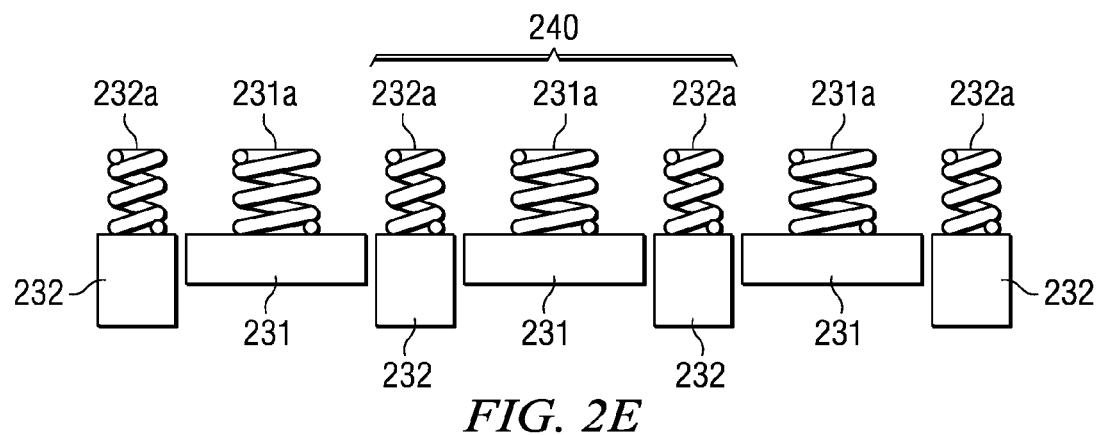

FIG. 2E shows a simplified depiction of the upper die tool of pressing system 220 including a plurality of pressing units 240 comprising a pair of second pressing heads 232 and associated springs 232(a) for pressing the package substrate 225 and a first pressing head 231 and associated springs 231(a) for pressing the IC die inbetween pressing heads 232. In a typical production system, the system can include hundreds or thousands of pressing units 240 in a 2 dimensional array, wherein the first pressing heads 231 are all synchronized to press at the same time, and the plurality of second pressing heads 232 are all synchronized to press at the same time, generally after the first pressing heads 231 press.

Figure 3A:
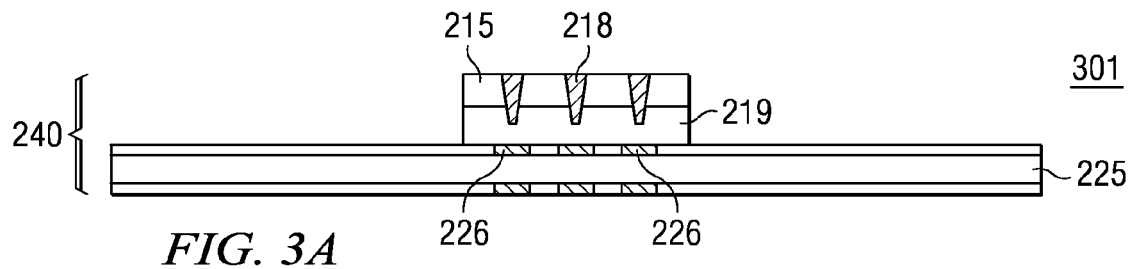
FIG. 3A-D shows a depiction of a process flow showing an exemplary pressing system for bonding/molding a plurality of stacked singulated IC die comprising a top IC die and bottom IC die on a package substrate, according to an embodiment of the invention.

FIG. 3A-D shows a depiction of a process flow comprising steps 301-304 and including a pressing system 220 for bonding a plurality of stacked singulated IC die comprising top IC die 216 and bottom IC die 215 on a package substrate 225, such as a PCB, according to an embodiment of the invention. In step 301 as shown in FIG. 3A, analogous to step 201 shown in FIG. 2A, a plurality of IC die including IC die 215 are placed and initially bonded to the package substrate 225 to form a bonded substrate 240 having a plurality of IC die 215 thereon. IC die 215 is shown having a plurality of TSVs 218. The CDF 219 is shown between the bottom of the IC die 215 and the substrate 225.

Figure 3B:
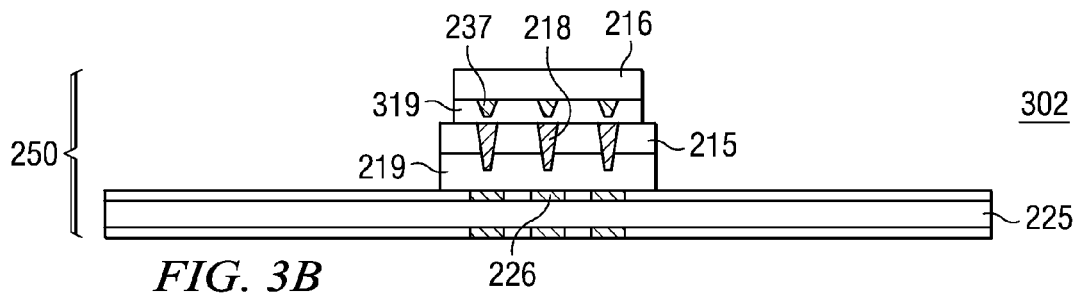
Figure 3C:
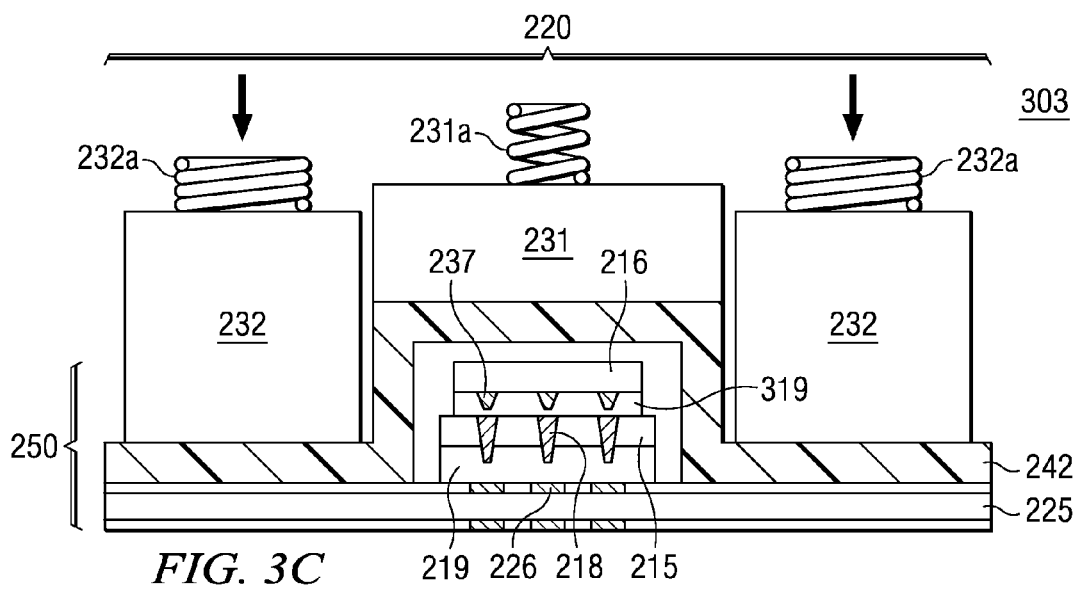

In step 302 shown in FIG. 3B, a second IC die 216 is placed and initially bonded to the first IC die 215, such as by using a temperature to obtain tackiness for CDF 219. Second IC die 216 is shown having a plurality of conventional bump pads 237 and a CDF layer 319 that is thicker than the height of the bump pads 237 thereon. A bonded substrate 250 having the stacked die 216/215 is shown in FIG. 3C after placement in pressing system 220 and the second pressing heads 232 are depressed to contact package substrate 225. A heat resistant buffer and release film 242 (e.g. PTFE) is shown attached to the pressing system 220. As in FIG. 2C, the second pressing heads 232 press the surface of the package substrate 225 before the first pressing head 231 presses the surface of IC die stack 216/215.

Figure 3D:
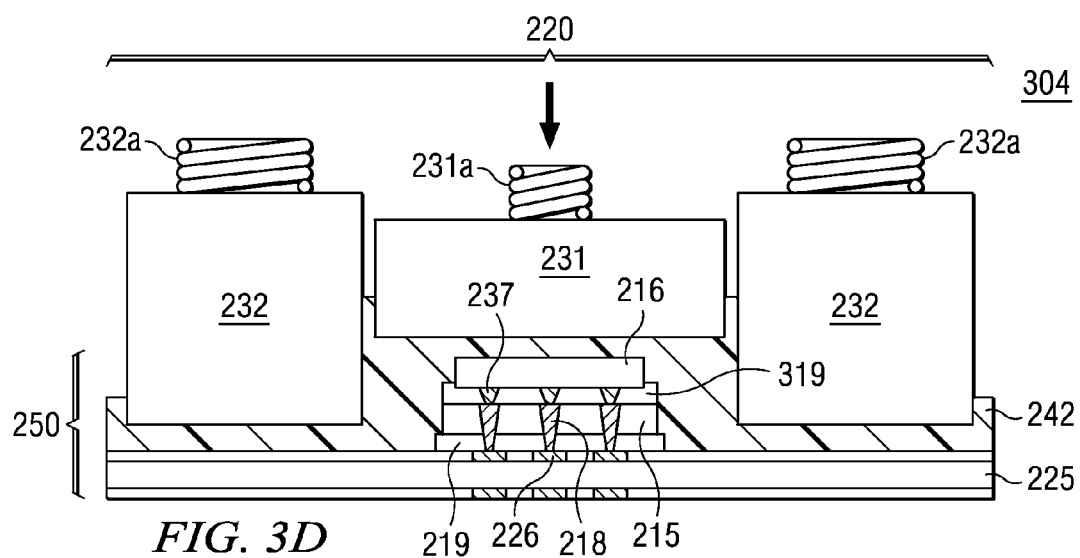

In step 304 as shown in FIG. 3D, the first pressing head 231 now presses the surface of the IC die/stack 216/215 while the second pressing head continues to press the package substrate 225 to maintain good flatness. Heat is applied (e.g. via first pressing head 231) sufficient to provide a second bonding to provide metallic bonding and also molding to form underfill, wherein a temperature during the pressing is sufficient to cure the CDFs 219 and 319 to form underfill and to form metallic joints between the plurality of IC bonding conductors (TSVs) 218 and the plurality of workpiece bonding conductors 226, and between bump pads 237 and the top of the TSVs 218. As described above, the heat resistant release film 242 protects the IC die stack 216/215 during pressing. As described above, the first pressing head 213 when it initially contacts the plurality of IC die including IC die stack 216/215 is at a maximum tilt angle of 0.2 degrees, typically ≦0.1 degrees.

Although not shown, pressing can occur with overmold on the bonded substrate to form the electronic assembly. In one embodiment, the electronic assembly can include bond wires, such as from the TSV comprising die to an underlying PCB that provides bonding sites lateral to the die.

As noted above, in one embodiment, the workpiece comprises a wafer comprising a plurality of non-singulated IC die. In this embodiment, the pressing system, which generally comprises a moveable upper die tool and a fixed lower die tool, generally comprises the upper die tool comprises a single bonding head for simultaneously pressing the plurality of IC die, wherein the wafer is positioned on the bottom die tool.

Figure 4A:
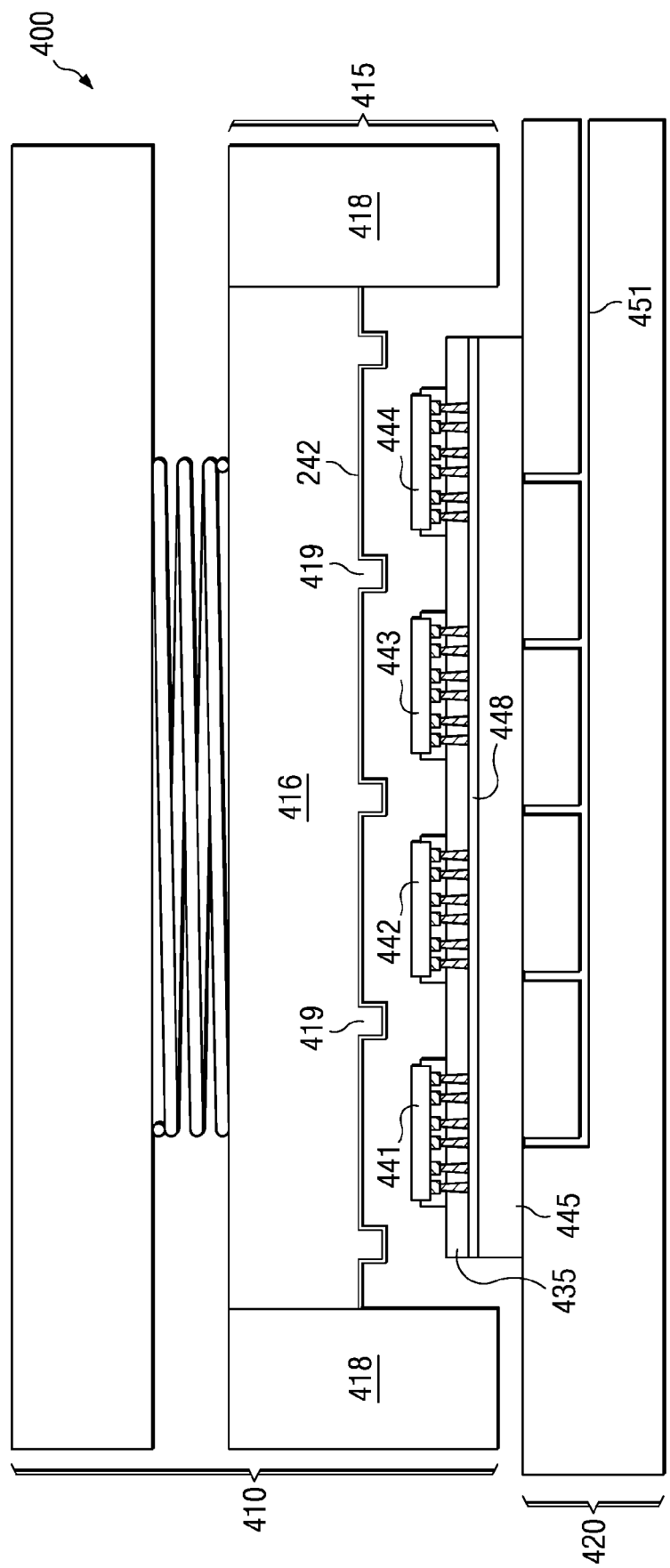
FIG. 4A shows a depiction of a pressing system before pressing comprising an upper die tool comprising a one-piece (single) panel pressing head and a bottom die tool, having a bonded assembly comprising plurality of IC die placed and first bonded on a TSV comprising wafer, according to an embodiment of the invention.

FIG. 4A shows a depiction of a pressing system 400 before pressing comprising an upper die tool 410 comprising a one-piece (single) panel pressing head 415 and a bottom die tool 420, having a bonded assembly 430 comprising plurality of IC die 441-444 placed and first bonded on a TSV comprising wafer 435. The TSV comprising wafer 435 is bonded to a carrier wafer 445 (e.g., quartz carrier wafer) by a temporary adhesive material 448. Bottom die tool 420 includes wafer suction line 451 for securing the bonded assembly 430 through a vacuum applied to the bottom side of carrier wafer 445.

Single panel pressing head 415 is shown including contacting plate 416 and perimeter side bars 418. The contacting plate 416 includes interior panel extension bars 419 located between the plurality of IC die 441-444 that extend beyond a height of planar portion of the contacting plate 416. The perimeter side bars 418 contact the bottom die tool 420 during pressing to form an enclosure around the plurality of IC die 441-444, and the interior panel extension bars 419 is shown forming a partially enclosed region around each of the plurality of IC die 441-444 by having a length selected to be short enough to not contact the TSV wafer 435 during pressing.

Figure 4B:
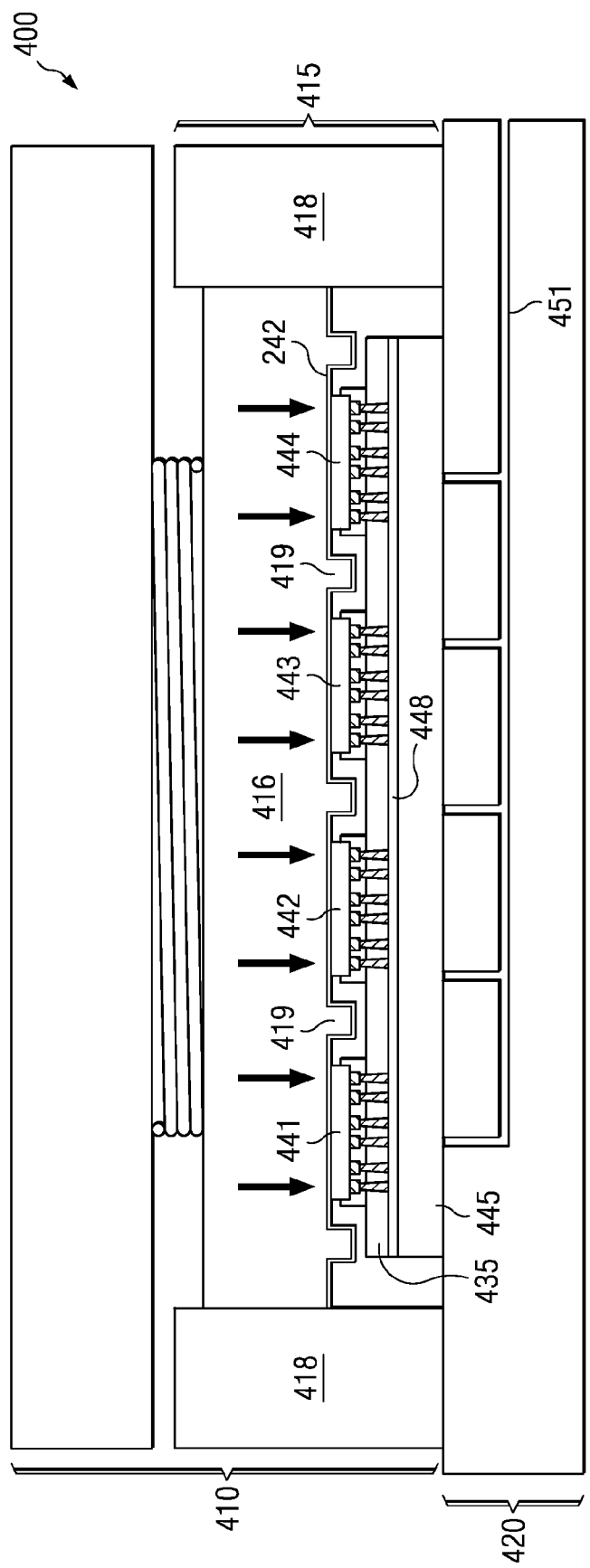
FIG. 4B shows a depiction of a pressing system shown in FIG. 4A while pressing.

FIG. 4B shows a depiction of a pressing system 400 shown in FIG. 4A near the end of pressing. Side bars 418 are seen to contact TSV wafer 435 while interior panel extension bars 419 are seen to not contact the surface of TSV wafer 435, but have a length sufficient to form a partially enclosed area around each IC die 441-444. The formation of partially enclosed areas around the ICs 441-444 has been found to reduce voids in the CDF and thus in the underfill formed.

Another embodiment of the invention comprises a pressing system including independent inner and outer pressing configured for simultaneously curing underfill precursors (e.g. resins) to form underfill and forming metallic joints between a plurality of ICs and a workpiece, wherein the pressing system includes structure for separately controlling the temperature of the upper and lower die tool. In one embodiment the Apic Yamada CDIM press tool is modified to add a thermal control system.

FIG. 5 shows a simplified exploded view depiction of a pressing system 500 including independent inner 231 and outer presses 232 configured for simultaneously curing resins such as CDFs to form underfill and form metallic joints between a plurality of ICs and a workpiece, according to an embodiment of the invention. The pressing system 500 includes a thermal control system for separately controlling the temperature of the upper die tool 525 and bottom die tool 530. Bonded substrate 515 is shown including ICs 516 and 517 having copper pillars 518 preliminarily placed face down (first bonded) to package substrate 519.

Outer press 232 of upper die tool 525 as described above prevents substrate expansion on the second bonding. This aspect of the invention generally provides flatness of the substrate 519 when the inner press 231 touches the IC dies 516 and 517 of within about 3 μm, which limits the maximum tilt angle and thus improves the joint alignment. Thermal control system 555 is operable to independently control the temperature of the upper die tool 525 and the bottom die tool 530. Thermal control system 555 is operable to engage a heater that heats inner presses 231 and outer press 232 of the upper die tool 525 and thus the surface of ICs 516 and 517, such as in a temperature range of 180 to 250° C. The bottom die tool 530 is generally temperature controlled by thermal control system 555 in cooperation with a cooling unit to maintain a temperature of substrate 519 of <60° C., such as 30 to 40° C. The bottom die tool 530 is shown in FIG. 5 including a cooling unit 531 and a low coefficient of expansion to plate 532, such as a ceramic plate. The package substrate sits on the plate 532 during bonding and molding processing.

Although pressing system 500 is generally described for pressing when the workpiece comprises a package substrate, pressing system 500 can be used as an alternative to pressing system 400 (single panel bonding head) for pressing when the workpiece comprises a wafer. To limit the pressure applied to the wafer, the applied pressure can be reduced and/or a protect film (e.g., heat resistant buffer and release film 242 (e.g., PTFE)) can be used.

FIG. 6A is a table showing exemplary process steps 1-4 and process states therein while FIG. 6B shows an exemplary plot that shows the IC and package substrate temperature and the force applied to the package substrate and IC, as a function of time, for process steps 1-4, obtainable using pressing system 500. To help prevent workpiece (e.g., substrate) expansion, the package substrate is first pressed at a relatively low temperature with outer press 232, then the temperature is raised. The substrate can be held with locator pins and suction holes on the bottom die tool 530 to minimize bump or other bonding conductor slippage. Without the substrate held, after IC die is held by inner pressing tool 231, free expansion of the package substrate could result in bump or other bonding conductor slippage.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

EXAMPLE

Embodiments of the present invention are further illustrated by the following specific Examples, which should not be construed as limiting the scope or content of embodiments of the invention in any way.

A series of experiments were performed to determine the effectiveness on underfill voiding by applying vacuum or no vacuum in combinations of the first and second bonding. The workpiece included solder bumps on copper land pads. It was found that air should be removed to <1 kPa (<7.5 torr) during the first bonding to obtain minimum voiding. Vacuum during the second bonding did not measurably reduce bonding as compared to using no vacuum for both the first and second bonding. It was concluded that once air remains in the layers through the first bonding, it did not remove upon the second bonding even with a vacuum. Significantly, if the first bonding is performed under vacuum, there is generally no advantage to second bonding with a vacuum. Void data obtained from the experiments performed is summarized in the Table below.

| $1^{st}$ Bonding | $2^{nd}$ Bonding | Voids |
|---|---|---|
| No Vac | Vac | Fractured smaller voids, ~2 μm |
| No Vac | No Vac | Big voids, 5~20 μm |
| Vac | No Vac | No voids found |

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. A method forming an electronic assembly, comprising:
providing (i) a plurality of IC die, said IC die each comprising a top surface including active circuitry and a bottom surface opposite said top surface, at least one of said top surface and said bottom surface comprising a plurality of IC bonding conductors which are coupled to said active circuitry and (ii) a workpiece comprising a workpiece surface having a plurality of workpiece bonding conductors thereon, said workpiece comprising a wafer comprising a plurality of non-singulated die;
applying a curable dielectric film to at least partially cover said plurality of IC bonding conductors or onto said workpiece surface;
placing said plurality of IC die on said workpiece surface so that said plurality of IC bonding conductors are aligned to and face said plurality of workpiece bonding conductors to provide a first bonding, wherein said placing is performed at a vacuum level corresponding to a pressure <1 kPa (<7.5 torr), and at a temperature high enough to provide tackiness to said curable dielectric film;
pressing said plurality of IC die to provide a second bonding, wherein a temperature during said pressing is sufficient to cure said curable dielectric adhesive film and to form metallic joints between said plurality of IC bonding conductors and said plurality of workpiece bonding conductors, wherein said pressing comprises using a pressing system comprising an upper die tool and a lower die tool, said upper die tool comprising a single bonding head for simultaneously pressing said plurality of IC die, wherein said wafer is positioned on said bottom die tool, further wherein said single bonding head includes interior panel extension bars located between said plurality of IC die that extend beyond a height of said single bonding head over said plurality of said IC die and outer side bars beyond said plurality of IC die for approaching but not contacting said wafer during said pressing to form an enclosure around said plurality of IC die.

2. The method of claim 1, wherein pressing is performed under ambient pressure conditions.

3. The method of claim 1, further comprising adding a heat resistant release film that is positioned to contact and protect surfaces of said plurality of IC die during said pressing.

4. The method of claim 1, wherein said plurality of IC bonding conductors comprises through substrate vias (TSVs) having protruding TSV tips, and said plurality of IC die are placed during said placing face-up on said workpiece surface.

5. The method of claim 1, wherein said plurality of IC bonding conductors comprise pillars or stud bumps, and wherein said plurality of IC die are placed during said placing in a flip-chip orientation on said workpiece surface.

6. The method of claim 1, wherein said interior panel extension bars have a length selected to not contact said wafer during said pressing.

7. A method forming an electronic assembly, comprising:
providing (i) a plurality of IC die, said IC die each comprising a top surface including active circuitry and a bottom surface opposite said top surface, at least one of said top surface and said bottom surface comprising a plurality of IC bonding conductors which are coupled to said active circuitry and (ii) a workpiece comprising a workpiece surface having a plurality of workpiece bonding conductors thereon, wherein said workpiece comprises a package substrate having a package substrate surface, and said plurality of IC comprises a plurality of singulated IC die;
applying a curable dielectric film to at least partially cover said plurality of IC bonding conductors or onto said workpiece surface;
placing said plurality of IC die on said workpiece surface so that said plurality of IC bonding conductors are aligned to and face said plurality of workpiece bonding conductors to provide a first bonding, wherein said placing is performed at a vacuum level corresponding to a pressure <1 kPa (<7.5 torr), and at a temperature high enough to provide tackiness to said curable dielectric film;
pressing said plurality of IC die to provide a second bonding, wherein a temperature during said pressing is sufficient to cure said curable dielectric adhesive film and to form metallic joints between said plurality of IC bonding conductors and said plurality of workpiece bonding conductors, said pressing utilizes a pressing system comprising a first pressing head for pressing each of said plurality of singulated IC die and an independently movable second pressing head for pressing said package substrate surface beyond said plurality of singulated IC die, wherein said first pressing head initially contacts said plurality of IC die at a maximum tilt angle of 0.2 degrees.

8. The method of claim 7, wherein said maximum tilt angle is <0.1 degrees.

9. The method of claim 7, wherein said second pressing head contacts said workpiece surface before said first pressing head contacts said plurality of singulated IC die.

10. The method of claim 7, wherein a force/area applied by said first pressing head to said plurality of IC die is less than a force/area applied by said second pressing head to said workpiece surface.

11. The method of claim 10, wherein said force/area applied by said first pressing head is between 0.5 and 30 Kgf/cm² and said force/area applied by said second pressing head is ≧60 Kgf/cm².

12. The method of claim 7, wherein during said pressing said plurality of singulated IC die are heated to a peak die temperature that is at least 100° C. above a peak workpiece temperature during said pressing.

13. The method of claim 12, wherein said peak die temperature is 180 to 250° C. and said peak workpiece temperature is <60° C.

14. The method of claim 1, wherein said temperature during said placing is 100 to 150° C., and said placing includes an applied force/area to said plurality of IC of 10 to 100 N/cm².

15. The method of claim 1, wherein said applying comprises applying said curable dielectric film, wherein a thickness of said curable dielectric film is sufficient to completely cover said plurality of IC bonding conductors.

16. The method of claim 1, wherein said plurality of IC bonding conductors comprise copper comprising TSVs having copper comprising tips or copper comprising pillars and said plurality of workpiece bonding conductors comprises copper bond pads, and said metallic joints comprise solder mediated copper joints.

17. A method forming an electronic assembly, comprising:
providing (i) a plurality of singulated IC die, said singulated IC die each comprising a top surface including active circuitry and a bottom surface opposite said top surface, at least one of said top surface and said bottom surface comprising a plurality of IC bonding conductors which are coupled to said active circuitry and (ii) a workpiece comprising a package substrate having a package substrate surface having a plurality of substrate bonding conductors thereon;

applying a curable dielectric film to at least partially cover said plurality of IC bonding conductors or onto said package substrate surface;

placing said plurality of singulated IC die on said package substrate surface so that said plurality of IC bonding conductors are aligned to and face said plurality of substrate bonding conductors to provide an first bonding, wherein said placing is performed at a temperature high enough to provide tackiness to said curable dielectric adhesive film, and pressing said plurality of singulated IC die to provide a second bonding, wherein a temperature during said pressing is sufficient to cure said curable dielectric adhesive film and to form metallic joints between said plurality of IC bonding conductors and said plurality of substrate bonding conductors;

further wherein said pressing utilizes a pressing system comprising a first pressing head for pressing each of said plurality of singulated IC die an independently movable second pressing head for pressing said package substrate surface beyond said plurality of singulated IC die, wherein (i) said first pressing head initially contacts said plurality of singulated IC die at a maximum tilt angle of 0.2 degrees, (ii) said second pressing head contacts said package substrate surface before said first pressing head contacts said plurality of singulated IC die, and (iii) a force/area applied by said first pressing head to said plurality of singulated IC die is less than a force/area applied by said second pressing head to said package substrate surface.

18. The method of claim 17, wherein said pressing is performed at a vacuum level corresponding to a pressure <1 kPa.

19. The method of claim 17, wherein said plurality of IC bonding conductors comprises through substrate via (TSV) tips, and wherein said applying comprises applying said curable dielectric film to said TSV tips, wherein a thickness of said curable dielectric film is sufficient to completely cover said TSV tips.

20. The method of claim 17, wherein said plurality of IC bonding conductors comprise pillars or stud bumps, and wherein said plurality of IC die are placed in said placing in a flip-chip orientation on said workpiece surface.

21. The method of claim 17, wherein said plurality of IC bonding conductors comprise copper comprising TSVs having copper comprising tips or copper comprising pillars and said plurality of workpiece bonding conductors comprises copper bond pads, and said metallic joints comprise solder mediated copper joints.

* * * * *